(12) United States Patent
Wann et al.

(10) Patent No.: US 9,525,049 B2
(45) Date of Patent: Dec. 20, 2016

(54) METHOD FOR FABRICATING FIN FIELD EFFECT TRANSISTORS

(71) Applicant: Taiwan Semiconductor Manufacturing Company, Ltd., Hsin-Chu (TW)

(72) Inventors: Clement Hsingjen Wann, Carmel, NY (US); Ling-Yen Yeh, Hsinchu (TW); Chi-Yuan Shih, Hsinchu (TW); Yi-Tang Lin, Hsinchu (TW); Chih-Sheng Chang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/018,709

(22) Filed: Feb. 8, 2016

(65) Prior Publication Data

US 2016/0155826 A1 Jun. 2, 2016

Related U.S. Application Data

(60) Continuation of application No. 14/605,540, filed on Jan. 26, 2015, now Pat. No. 9,257,343, which is a
(Continued)

(51) Int. Cl.
| | |
|---|---|
| *H01L 21/8234* | (2006.01) |
| *H01L 29/66* | (2006.01) |
| *H01L 21/8238* | (2006.01) |
| *H01L 21/84* | (2006.01) |
| *H01L 27/092* | (2006.01) |

(Continued)

(52) U.S. Cl.
CPC ..... *H01L 29/66818* (2013.01); *H01L 21/2236* (2013.01); *H01L 21/823431* (2013.01);
(Continued)

(58) Field of Classification Search
CPC .............. H01L 27/115; H01L 27/11568; H01L 29/66833; H01L 29/785; H01L 29/792; H01L 21/845; H01L 27/0688; H01L 27/11578; H01L 27/1211; H01L 29/4234; H01L 29/66795
(Continued)

(56) References Cited

U.S. PATENT DOCUMENTS 7,115,947 B2 10/2006 Clark, Jr. et al.
7,709,303 B2 5/2010 Burnett
(Continued)

FOREIGN PATENT DOCUMENTS

| JP | 2009-260029 | 11/2009 |
|---|---|---|
| KR | 10-2005-0066963 | 6/2005 |
| KR | 10-2007-0003861 | 1/2007 |

OTHER PUBLICATIONS

Office Action dated Apr. 25, 2013 and English translation from corresponding application No. KR 10-2012-0003125.

*Primary Examiner* — William F Kraig
*Assistant Examiner* — Edward Chin
(74) *Attorney, Agent, or Firm* — Haynes and Boone, LLP

(57) ABSTRACT

A method of fabricating a Fin field effect transistor (FinFET) includes providing a substrate having a first fin and a second fin extending above a substrate top surface, wherein the first fin has a top surface and sidewalls and the second fin has a top surface and sidewalls. The method includes forming an insulation layer between the first and second fins. The method includes forming a first gate dielectric having a first thickness covering the top surface and sidewalls of the first fin using a plasma doping process. The method includes forming a second gate dielectric covering the top surface and sidewalls of the second fin having a second thickness less than the first thickness. The method includes forming a conductive gate strip traversing over both the first gate dielectric and the second gate dielectric.

20 Claims, 7 Drawing Sheets

Related U.S. Application Data division of application No. 13/293,732, filed on Nov. 10, 2011, now Pat. No. 8,963,257.

(51) Int. Cl.
  *H01L 27/12* (2006.01)
  *H01L 21/223* (2006.01)

(52) U.S. Cl.
  CPC .............. *H01L 21/823462* (2013.01); *H01L 21/823807* (2013.01); *H01L 21/823814* (2013.01); *H01L 21/823821* (2013.01); *H01L 21/823857* (2013.01); *H01L 21/823878* (2013.01); *H01L 21/845* (2013.01); *H01L 27/0924* (2013.01); *H01L 27/1211* (2013.01)

(58) Field of Classification Search
  USPC .................. 257/E21.409, E21.423, E21.679, 257/E21.703, E27.103, E27.112, E29.309, 324; 438/197, 268
  See application file for complete search history.

(56) References Cited

U.S. PATENT DOCUMENTS

| | | | |
|---|---|---|---|
| 7,888,751 B2* | 2/2011 | Sawada | H01L 29/66795 257/328 |
| 8,263,459 B2* | 9/2012 | Blomme | H01L 21/28273 257/E21.624 |
| 8,603,893 B1* | 12/2013 | Wei | H01L 21/76229 257/E21.546 |
| 8,618,556 B2* | 12/2013 | Wu | H01L 21/82382 257/76 |
| 8,772,858 B2 | 7/2014 | Hsu | |
| 2007/0161171 A1* | 7/2007 | Burnett | H01L 21/845 438/197 |
| 2008/0087942 A1* | 4/2008 | Hsu | H01L 27/115 257/324 |
| 2008/0285350 A1* | 11/2008 | Yeh | G11C 16/0466 365/185.17 |
| 2009/0179282 A1* | 7/2009 | Doyle | H01L 21/28247 257/410 |

\* cited by examiner

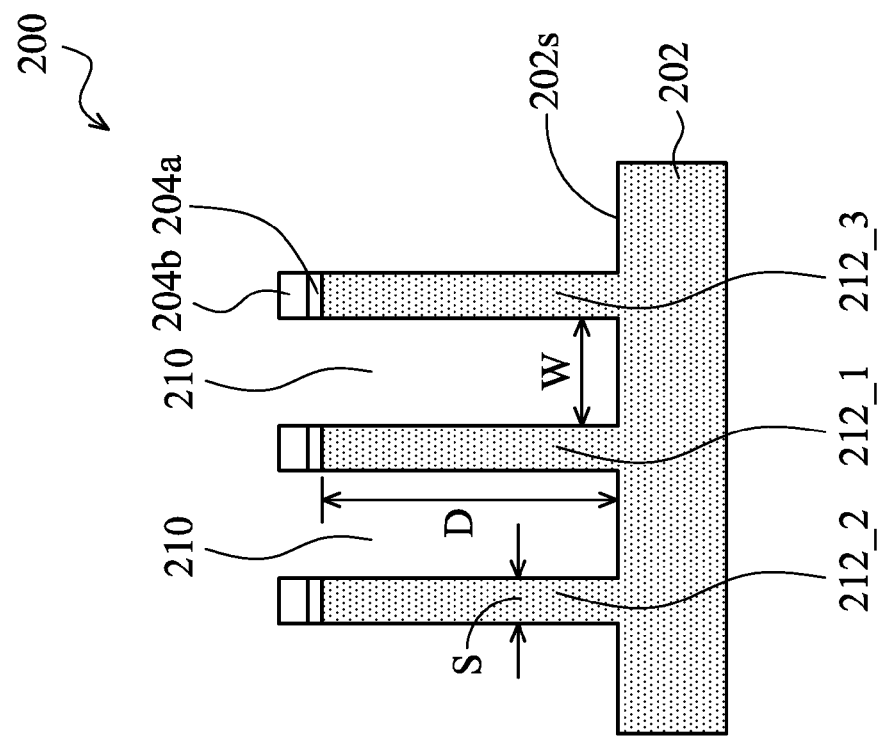
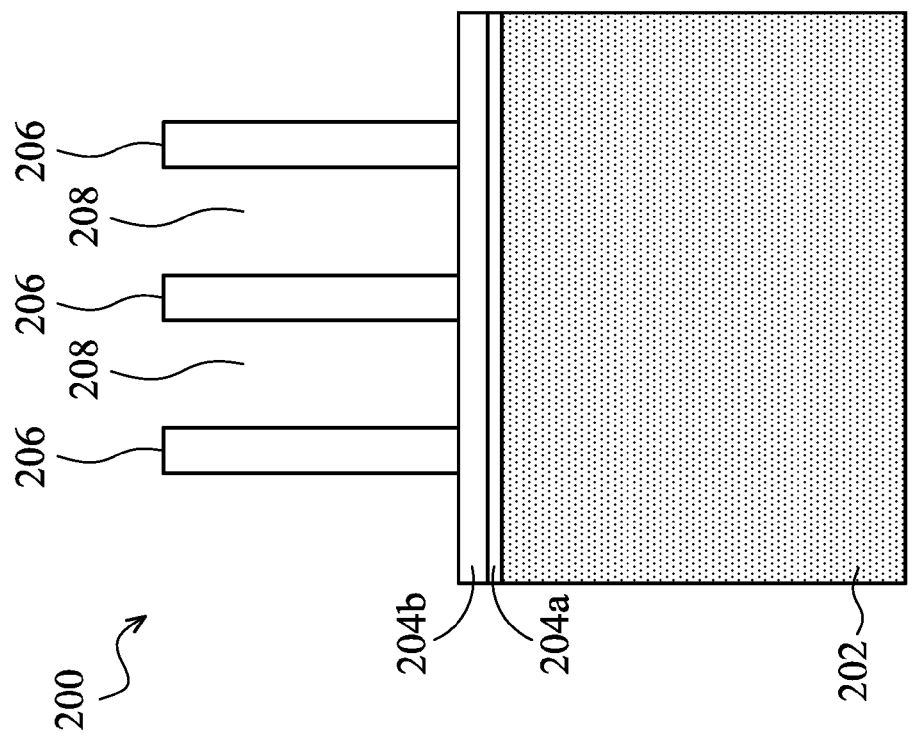
FIG. 3
FIG. 2

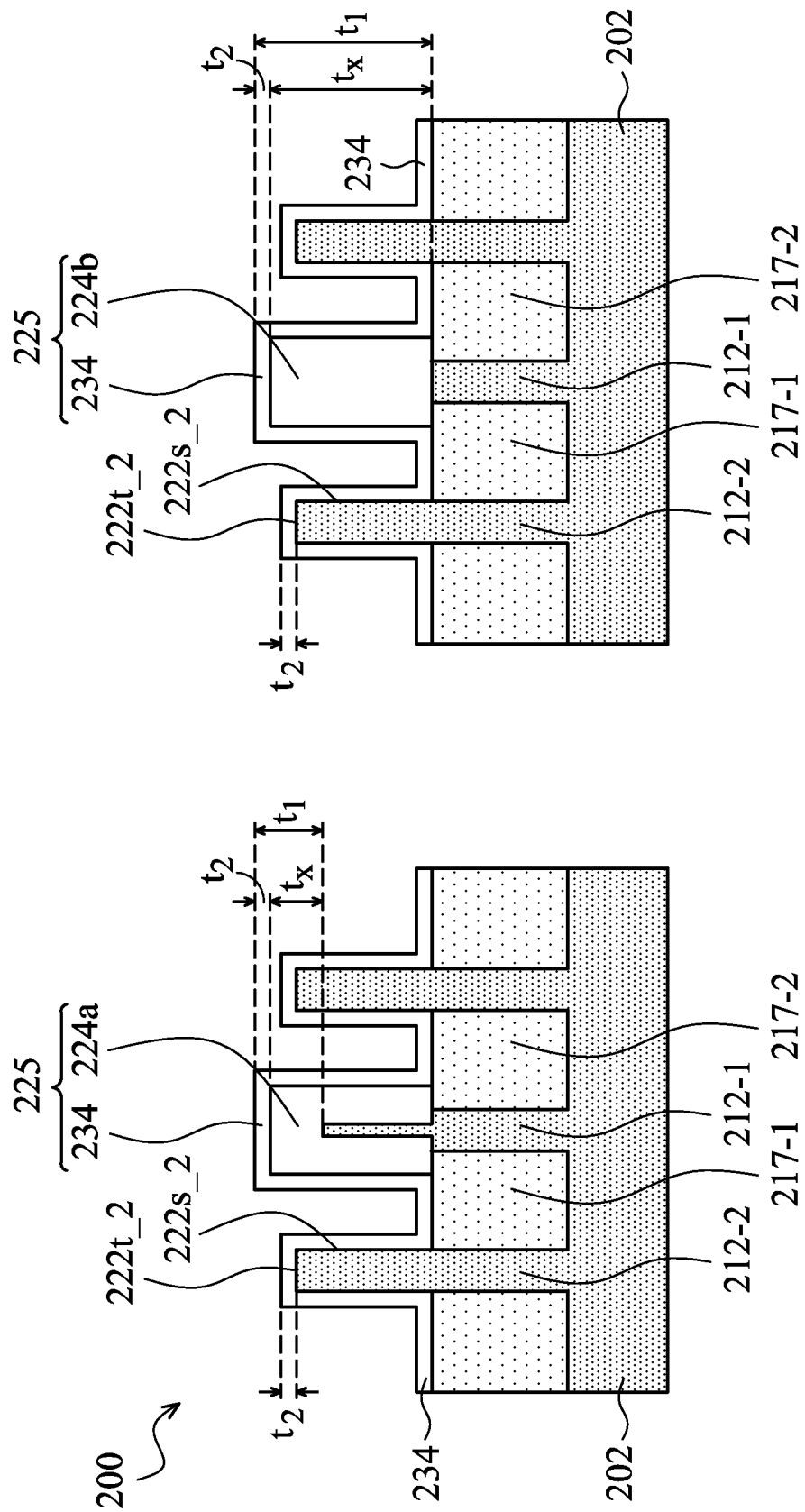

METHOD FOR FABRICATING FIN FIELD EFFECT TRANSISTORS

PRIORITY CLAIM

The present application is a continuation of Ser. No. 14/605,540, filed Jan. 26, 2015, issuing as U.S. Pat. No. 9,257,343 on Feb. 9, 2016, which is a divisional of U.S. application Ser. No. 13/293,732, filed Nov. 10, 2011, each of which are incorporated herein by reference in their entirety.

FIELD OF THE INVENTION

This disclosure relates to integrated circuit fabrication, and more particularly to a fin field effect transistor.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). A typical FinFET is fabricated with a thin vertical fin" (or fin structure) extending from a substrate, for example, etched into a silicon layer of the substrate. The channel of the FinFET is formed in this vertical fin. A gate is provided over three sides (e.g., wrapping) the fin. Having a gate on both sides of the channel allows gate control of the channel from both sides. In addition, strained materials in recessed source/drain (S/D) portions of the FinFET utilizing selectively grown silicon germanium (SiGe) may be used to enhance carrier mobility.

However, there are challenges to implement such features and processes in complementary metal-oxide-semiconductor (CMOS) fabrication. For example, it is difficult to achieve a flexible circuit design using a FinFET because the FinFET is formed of a plurality of identical fins for feasible FinFET fabrication.

Accordingly, what are needed are an improved FinFET structure and a method of fabricating the FinFET.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-10B are schematic cross-sectional views of a FinFET at various stages of fabrication according to various embodiments of the present disclosure.

DESCRIPTION

Figure 1:
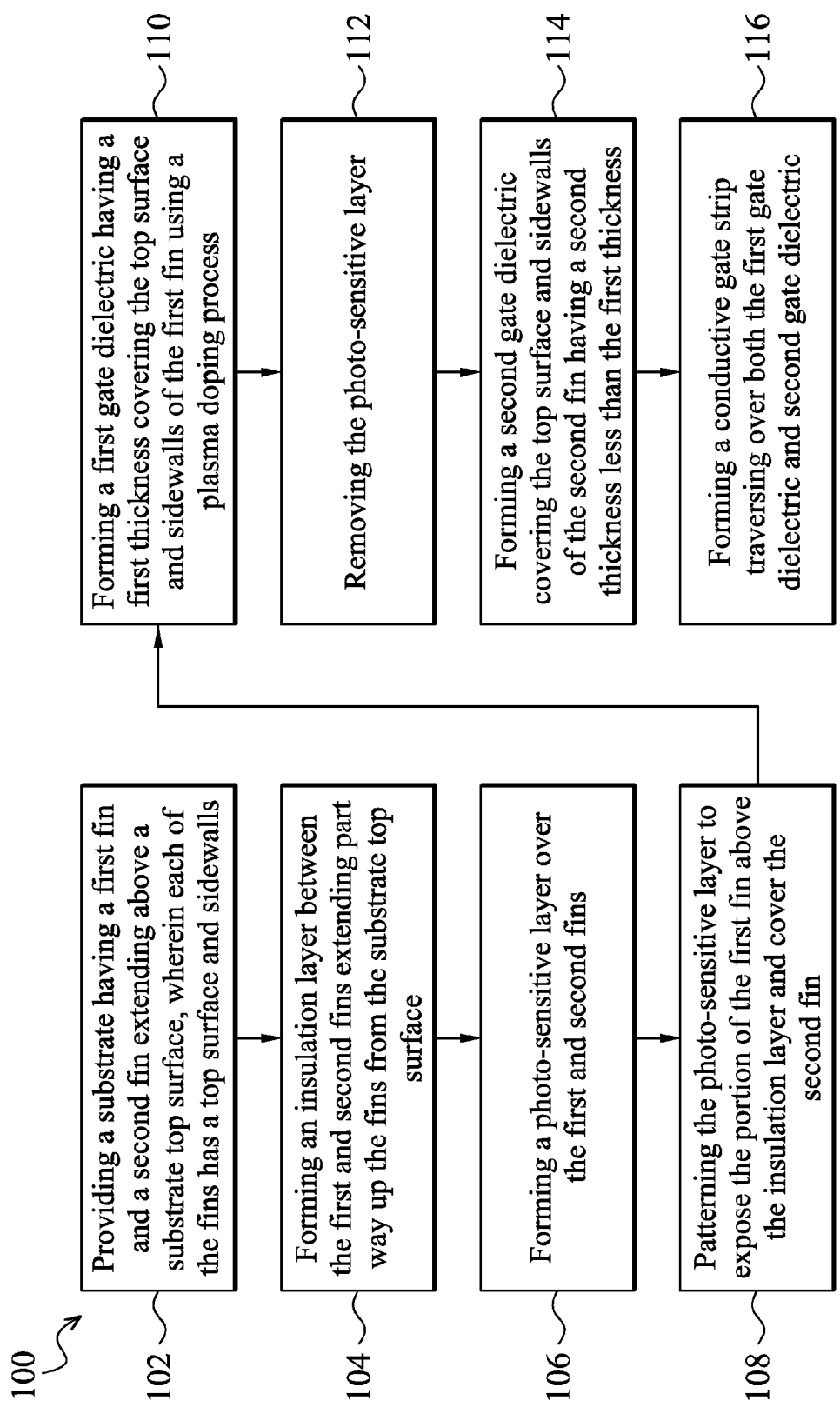
FIG. 1 is a flowchart of a method of fabricating a FinFET according to various embodiments of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may are not in direct contact. In addition, the present disclosure may repeat reference numerals and/or letters in the various examples.

Referring to FIG. 1, illustrated is a flowchart of a method 100 of fabricating a Fin field effect transistor (FinFET) according to various embodiments of the present disclosure. The method 100 begins with step 102 in which a substrate having a first fin and a second fin extending above a substrate top surface is provided, wherein each of the fins has a top surface and sidewalls. The method 100 continues with step 104 in which an insulation layer is formed between the first and second fins extending part way up the fins from the substrate top surface. The method 100 continues with step 106 in which a photo-sensitive layer is formed over three surfaces (i.e. wraps) the first and second fins. The method 100 continues with step 108 in which the photo-sensitive layer is patterned to expose the portion of the first fin above the insulation layer while maintaining coverage of the second fin. The method 100 continues with step 110 in which a first gate dielectric having a first thickness is formed covering the top surface and sidewalls (i.e. wraps) of the first fin using a plasma doping process. The method 100 continues with step 112 in which the photo-sensitive layer is removed. The method 100 continues with step 114 in which a second gate dielectric is formed covering the top surface and sidewalls (i.e. wraps) of the second fin having a second thickness less than the first thickness. The method 100 continues with step 116 in which a conductive gate strip is formed traversing over both the first gate dielectric and second gate dielectric. The discussion that follows illustrates an embodiment of a method in accordance with FIG. 1.

FIGS. 2-10B are schematic cross-sectional views of a FinFET 200 at various stages of fabrication according to various embodiments of the present disclosure. As employed in the present disclosure, the FinFET 200 refers to any fin-based, multi-gate transistor. The FinFET 200 may be included in a microprocessor, memory cell, and/or other integrated circuit (IC). It is noted that the method of FIG. 1 does not produce a completed FinFET 200. A completed FinFET 200 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 1 through 10B are simplified for a better understanding of the present disclosure. For example, although the figures illustrate the FinFET 200, it is understood the IC may comprise a number of other devices comprising resistors, capacitors, inductors, fuses and/or other devices known in the art.

Referring to FIG. 2, a substrate 202 is provided. In one embodiment, the substrate 202 comprises a crystalline silicon substrate (e.g., wafer). The substrate 202 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

The substrate 202 may alternatively comprise some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 202 may comprise an epitaxial layer (epi-layer), may be strained for performance enhancement, and/or may comprise a silicon-on-insulator (SOI) structure.

The fins extending above a substrate top surface are formed after etching into the substrate 202, wherein each of the fins has a top surface and sidewalls. In some embodiments, a pad layer 204a and a mask layer 204b are formed on the semiconductor substrate 202. The pad layer 204a may be a thin film comprising silicon oxide formed, for example, using a thermal oxidation process. The pad layer 204a may act as an adhesion layer between the semiconductor substrate 202 and mask layer 204b. The pad layer 204a may also act as an etch stop layer for etching the mask layer 204b. In some embodiments, the mask layer 204b is formed of silicon nitride, for example, using low-pressure chemical vapor deposition (LPCVD) or plasma enhanced chemical vapor deposition (PECVD). The mask layer 204b can be used as a hard mask during subsequent photolithography processes. A photo-sensitive layer 206 is formed on the mask layer 204b and is then patterned, forming openings 208 in the photo-sensitive layer 206.

Referring to FIG. 3, the mask layer 204b and pad layer 204a are etched through openings 208, exposing the underlying semiconductor substrate 202. The exposed semiconductor substrate 202 is then etched to form trenches 210 with a substrate top surface 202s. Portions of the semiconductor substrate 202 between trenches 210 form a plurality of identical semiconductor fins. In some embodiments, the plurality of the identical semiconductor fins comprise first fin 212_1 and second fin 212_2. In alternative embodiments, the plurality of the identical semiconductor fins comprise first fin 212_1, second fin 212_2, and third fin 212_3. Trenches 210 may be strips (in the top view) parallel to each other, and closely located from each other. For example, the spacing S between trenches 210 may be smaller than about 30 nm. In some embodiments, the spacing S between trenches 210 may be between about 30 nm and about 15 nm. In other embodiments, the spacing S between trenches 210 may be between about 15 nm and about 2 nm. The photo-sensitive layer 206 is then removed. Next, a cleaning may be performed to remove a native oxide of the semiconductor substrate 202. The cleaning may be performed using diluted hydrofluoric (DHF) acid.

Depth D of the trenches 210 may be between about 2100 Å and about 2500 Å, while width W of the trenches 210 is between about 300 Å and about 1500 Å. In some embodiments, the aspect ratio (D/W) of the trenches 210 is greater than about 7.0. In other embodiments, the aspect ratio may be greater than about 8.0, although the aspect ratio may also be lower than about 7.0, or between 7.0 and 8.0. One skilled in the art will realize, however, that the dimensions and values recited throughout this description are merely examples, and may be changed to suit different scales of integrated circuits.

An insulation layer may be formed between the fins extending part way up the fins from the substrate top surface 202s to isolate the fins from each other. In some embodiments, liner oxide (not shown) is optionally formed in the trenches 210. In some embodiments, liner oxide may be a thermal oxide having a thickness between about 20 Å to about 500 Å. In other embodiments, liner oxide may be formed using in-situ steam generation (ISSG) and the like. The formation of liner oxide rounds corners of the trenches 210, which reduces the electrical fields, and hence improves the performance of the resulting integrated circuit (IC).

Figure 4:
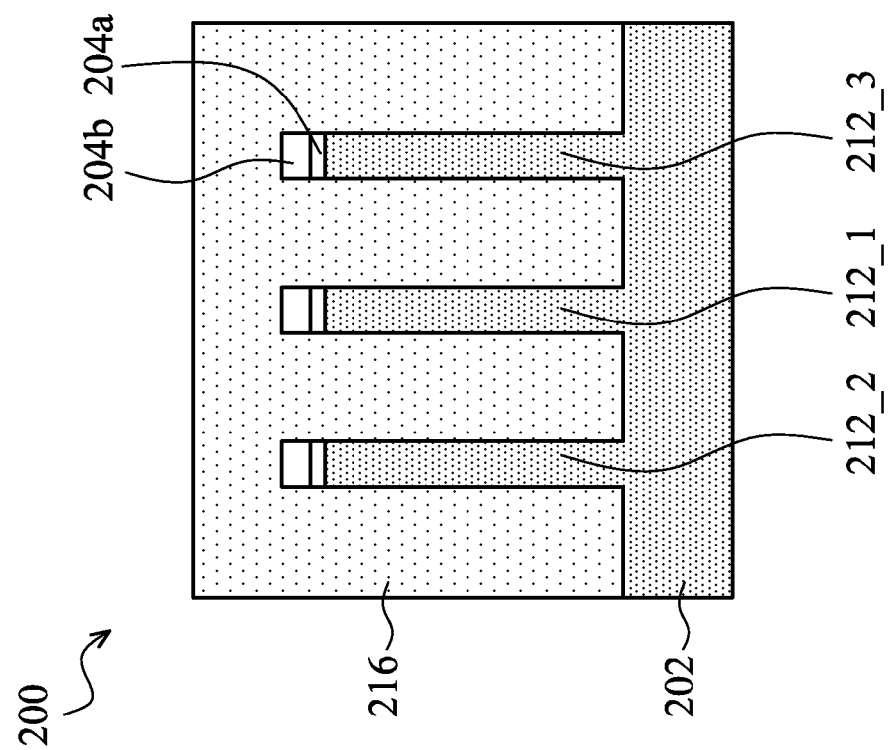

In some embodiments, the trenches 210 are then filled with a dielectric material 216. FIG. 4 shows the resulting structure after the deposition of the dielectric material 216. The dielectric material 216 may comprise silicon oxide, although other dielectric materials, such as silicon nitride, silicon oxynitride, fluoride-doped silicate glass (FSG), or a low-K dielectric material, may also be used. In some embodiments, the dielectric material 216 may be formed using a high-density-plasma (HDP) CVD process, using silane ($SiH_4$) and oxygen ($O_2$) as reacting precursors. In other embodiments, the dielectric material 216 may be formed using a sub-atmospheric CVD (SACVD) process or high aspect-ratio process (HARP), wherein process gases may comprise tetraethylorthosilicate (TEOS) and ozone ($O_3$). In yet other embodiments, the dielectric material 216 may be formed using a spin-on-dielectric (SOD) process, such as hydrogen silsesquioxane (HSQ) or methyl silsesquioxane (MSQ).

Figure 5:
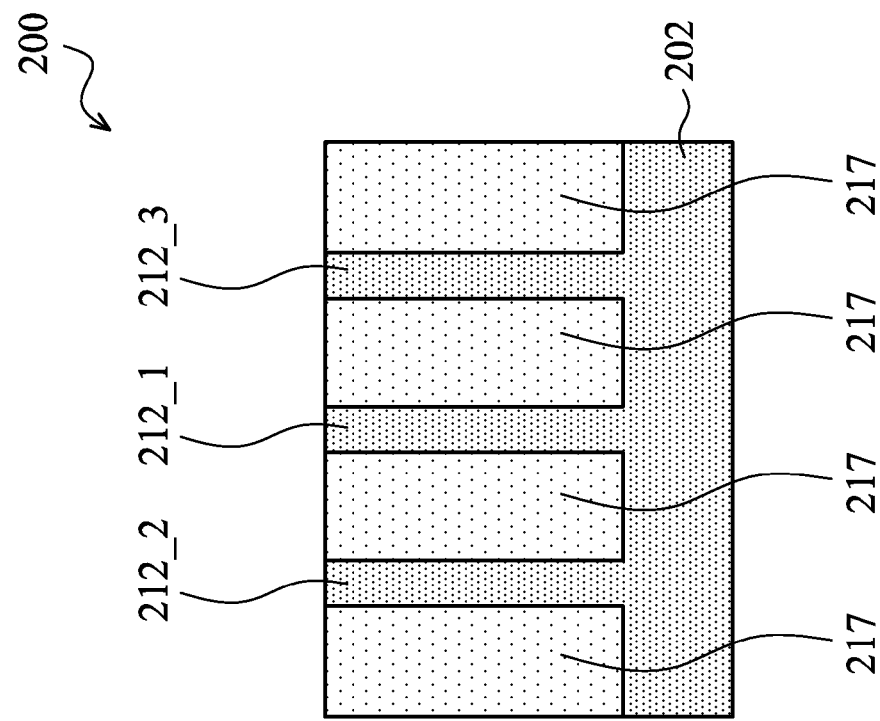

In some embodiments, a chemical mechanical polish (CMP) is then performed, followed by the removal of the mask layer 204b and pad layer 204a, producing the structure shown in FIG. 5. The remaining portions of the dielectric material 216 in the trenches 210 are hereinafter referred to as an insulation layer 217. The mask layer 204b, if formed of silicon nitride, may be removed using a wet process using hot $H_3PO_4$, while pad layer 204a may be removed using diluted HF acid, if formed of silicon oxide. In alternative embodiments, the removal of the mask layer 204b and pad layer 204a may be performed after the recessing of the insulation layer 217, which recessing step is shown in FIG. 6.

Figures 6, 7:
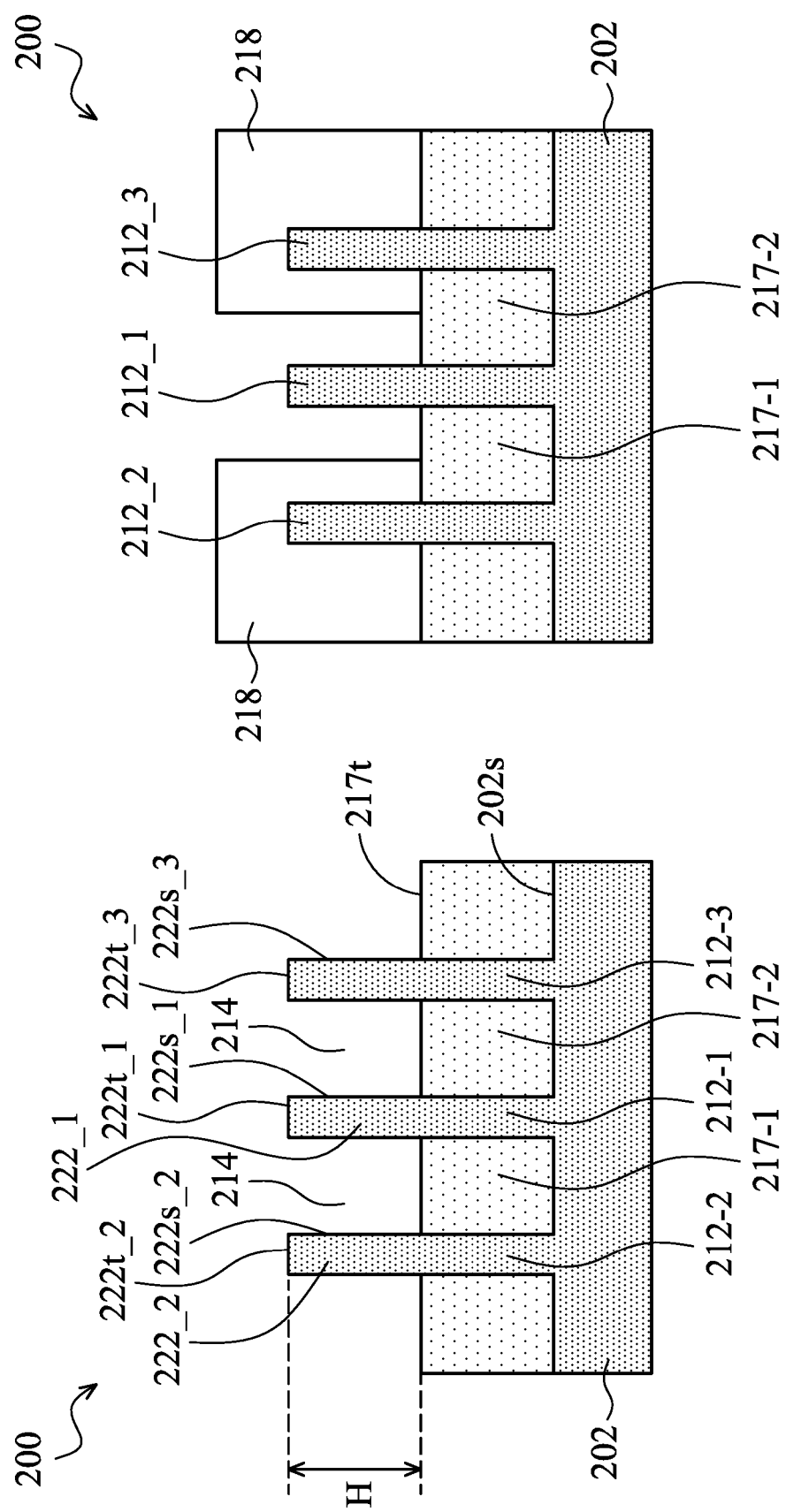

As shown in FIG. 6, the insulation layer 217 is recessed by an etching step, resulting in recesses 214 to form a plurality of upper portions (denoted as 222_1, 222_2, and 222_3) of the plurality of semiconductor fins (denoted as 212_1, 212_2, and 212_3). In some embodiments, the remaining insulation layer 217 may comprise a first insulation layer 217_1 to isolate the first fin 212_1 and the second fin 212_2 and a second insulation layer 217_2 to isolate the first fin 212_1 and the third fin 212_3. In some embodiments, the etching step may be performed using a wet etching process, for example, by dipping the FinFET 200 in hydrofluoric acid (HF). In other embodiments, the etching step may be performed using a dry etching process, for example, the dry etching process may be performed using $CHF_3$ or $BF_3$ as etching gases.

In some embodiments, the remaining insulation layer 217 comprises flat top surfaces 217t. In other embodiments, the remaining insulation layer 217 comprises curved top surfaces (nor shown). Further, the plurality of the upper portions of the plurality of semiconductor fins protruding over the flat top surfaces 217t of the remaining insulation layer 217 are used to form channel regions of the FinFETs 200. In other words, the remaining insulation layer 217_1 between the first fin 212_1 and the second fin 212_2 extending part way up the fins 212_1, 212_2 from the substrate top surface 202s. The remaining insulation layer 217_2 between the first fin 212_1 and the third fin 212_3 extending part way up the fins 212_1, 212_3 from the substrate top surface 202s. In the some embodiments, each of the plurality of the upper portions of the plurality of the semiconductor fins comprise a top surface (denoted as 222t_1, 222t_2, and 222t_3) and sidewalls (denoted as 222s_1, 222s_2, and 222s_3). Height H of the upper portions of the semiconductor fins may be between 15 nm and about 50 nm, although the height may also be greater or smaller.

In some embodiments, the process steps up to this point have provided the substrate 202 having the first fin 212_1 and second fin 212_2 extending above the substrate top surface 202s, wherein each of the fins 212_1, 212_2 has the top surface 222t_1, 222t_2 and sidewalls 222s_1, 222s_2, wherein the insulation layer 217 between the first and second fins 212_1, 212_2 extending part way up the fins 212_1, 212_2 from the substrate top surface 202s. Then, a conductive gate strip is formed to cover the top surfaces 222t_1, 222t_2 and sidewalls 222s_1, 222s_2 of the plurality of fins 212_1, 212_2 to establish an electrical connection between the fins 212_1, 212_2 to form a FinFET. It should be noted that the FinFET formed of a plurality of identical fins is feasible for FinFET manufacturing, but may provide excessive on-current if the FinFET comprises more fins than needed, thereby decreasing a flexible circuit design while using the FinFET.

Accordingly, the processing discussed below with reference to FIGS. 7-10B may form a thinner gate dielectric on a selected fin to enable channel regions of the selected fin of a FinFET, but form a thicker gate dielectric on an un-selected fin to disable channel regions of the un-selected fin of the FinFET. The processing helps avoid problems associated with excessive on-current of a FinFET, thereby increasing FinFET circuit design flexibility.

Referring to FIG. 7, a photo-sensitive layer 218 is formed over the first fin 212_1 and the second fin 212_2 by a suitable process, such as spin-on coating. In some embodiments, the photo-sensitive layer 218 is patterned to expose the portion of the first fin 212_1 above the insulation layer 217 and cover the second fin 212_2.

Figures 8A, 8B:
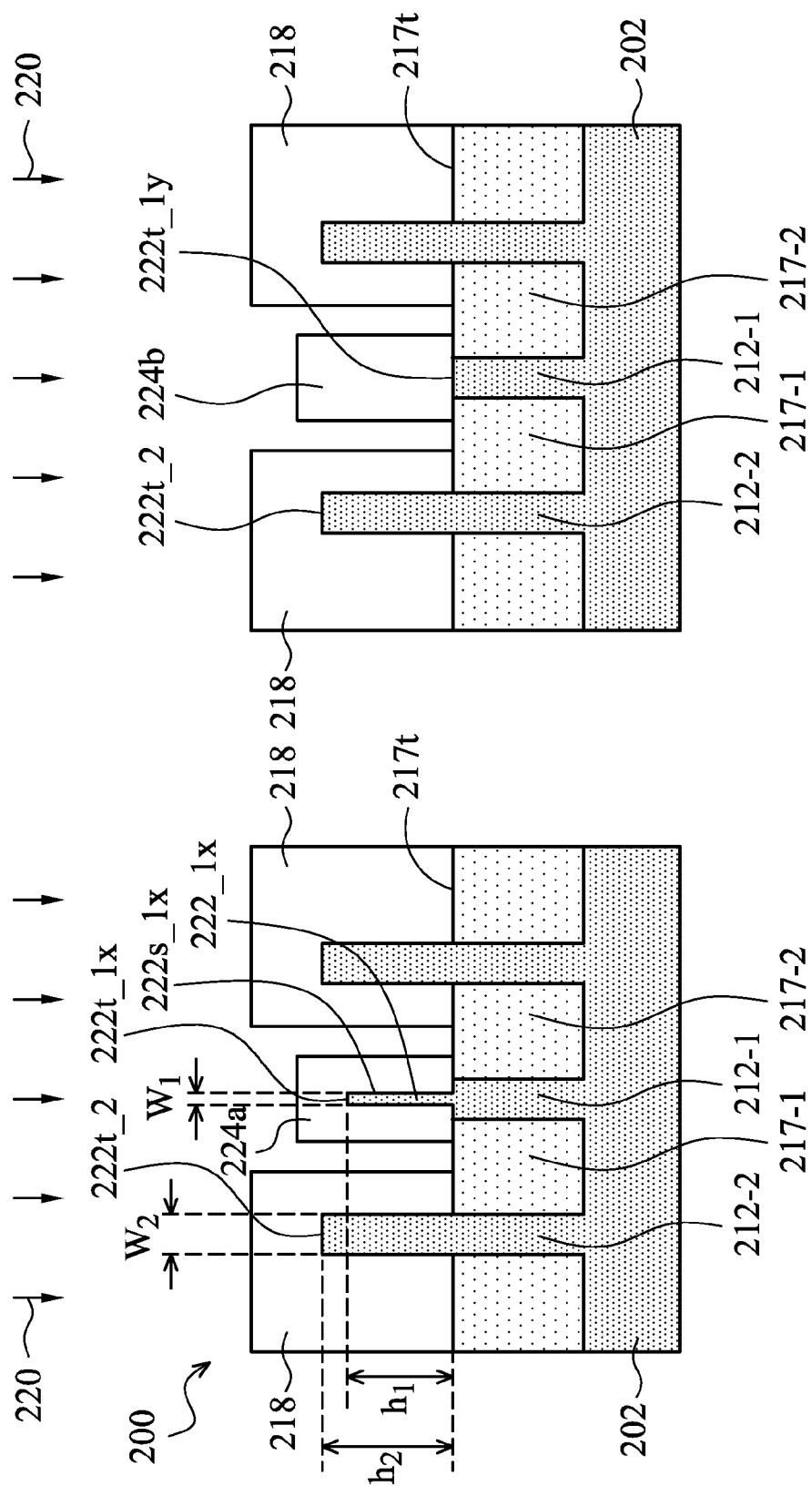

FIG. 8A shows the FinFET 200 of FIG. 7 after a first gate dielectric 224a is formed covering the top surface 222t_1x and sidewalls 222s_1x of the first fin 212_1. The step of forming the first gate dielectric 224a is performed using a plasma doping process 220, so as to avoid damage of the photo-sensitive layer 218. FIG. 8B shows the FinFET 200 of FIG. 7 after a first gate dielectric 224b is formed covering the top surface 222t_1y of the first fin 212_1. The step of forming the first gate dielectric 224b is performed using a plasma doping process 220, so as to avoid damage of the photo-sensitive layer 218. In some embodiments, the plasma doping process 220 comprises an oxygen-containing plasma doping process. For example, the step of the plasma doping process 220 is performed under a power of about 260 to 2500 W, a bias voltage of about −200V to −20 kV, and a pressure of about 1 to 50 mTorr, using $O_2$, $O_3$, or $H_2O$ as doping gases. Then, the photo-sensitive layer 218 is removed.

It should be noted that a bias voltage used in the plasma doping process 220 may be tuned to allow better control of a thickness of the first gate dielectric 224a or 224b to achieve desired profiles for the oxidation of the first fin 212_1. For example, the plasma doping process directly uses the plasma ions that flow into the reaction chamber to react, whereby forming a reacted boundary layer on the exposed surface of the fin, and the boundary layer will be changed in accordance with the variation of the dopant concentration.

On the contrary, the concept for pulsed plasma doping is using the gas flow into the reaction chamber with intermittent voltage method controlled by add/non-add voltage, so as to separate positive ions from the gas. Then the positive ions move forward to the fin surface so the boundary layer is uniform and steady-state. Accordingly, the driving force can be controlled to keep constant.

In some embodiments, the first gate dielectric 224a or 224b is annealed after the plasma doping process 220. In alternative embodiments, the first gate dielectric 224a or 224b is annealed after formation of a second gate dielectric 234 (shown in FIGS. 9A and 9B). In other word, the first gate dielectric 224a or 224b and the second gate dielectric 234 may be simultaneously annealed after forming the second gate dielectric 234.

If the plasma doping drives the oxygen too close to the surface of the first fin 212_1, an outer portion of the upper portion of the first fin 212_1 is partially consumed due to reaction with the plasma ions to form a first gate dielectric 224a, while the upper portion of the second fin 212_2 is protected by the photo-sensitive layer 218 (shown in FIG. 8A). Thus, the first gate dielectric 224a covers a top surface 222t_1x and sidewalls 222s_1x of the remaining upper portion 222_1x of the first fin 212_1. In some embodiments, the top surface 222t_1x of the first fin 212_1 is lower than the top surface 222t_2 of the second fin 212_2. In other embodiments, the top surface 217t of the insulation layer 217 is lower than the top surface 222t_1x of the first fin 212_1. In still other embodiments, the upper portion 222_1x of the first fin 212_1 extending above the insulation layer 217 is thinner than the upper portion of the second fin 212_2 extending above the insulation layer 217.

If the plasma doping drives the oxygen too close to the center of the first fin 212_1, material of the first fin 212_1 above the top surface 217t of the insulation layer 217 may be fully consumed due to reaction with the plasma ions to form a first gate dielectric 224b (shown in FIG. 8B). In other words, the top surface 217t of the insulation layer 217 is substantially coplanar with the top surface 222t_1y of the first fin 212_1. In some embodiments, the top surface 222t_1y of the first fin 212_1 is lower than the top surface 222t_2 of the second fin 212_2. Since operation of the FinFET does not turn on the first fin 212_1 (un-selected fin), additional material consumption of the first fin 212_1 under top surface of the insulation layer 217 is allowable.

In some embodiments, a ratio of a width $W_1$ of a portion of the first fin 212_1 extending above the insulation layer 217 to a width $W_2$ of a portion of the second fin 212_2 extending above the insulation layer 217 is from 0 to 0.95. In some embodiments, a ratio of a height $h_1$ of the first fin 212_1 above the insulation layer 217 to a height $h_2$ of the second fin 212_2 above the insulation layer 217 is from 0 to 0.95.

Referring to FIGS. 9A and 9B, after the first gate dielectric 224a or 224b formation process and removal of the photo sensitive layer 218, a second gate dielectric 234 is formed covering the top surface 222t_2 and sidewalls 222s_2 of the second fin 212_2 and the first gate dielectric 224a or 224b. In some embodiments, the second gate dielectric 234 comprises silicon oxide, silicon nitride, silicon oxy-nitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. The second gate dielectric 234 may be formed using a suitable process such as atomic layer deposition (ALD), chemical vapor deposition (CVD), physical vapor deposition (PVD), thermal oxidation, UV-ozone oxidation, or combinations thereof. The second gate dielectric 234 may further comprise an interfacial layer (not shown) to reduce damage between the second gate dielectric 234 and the second fin 212_2. The interfacial layer comprises silicon oxide.

In some embodiments, the second gate dielectric 234 is a high-k dielectric layer with a second thickness $t_2$ in the range of about 10 Å to about 30 Å. Structurally, the first gate dielectric 224a or 224b and a portion of the second gate dielectric 234 covering the first gate dielectric 224a or 224b are combined and hereafter referred to as a combined gate dielectric 225. Therefore, a first thickness $t_1$ of the combined gate dielectric 225 is summation of the thickness $t_x$, of the first gate dielectric 224a or 224b and the second thickness $t_2$ of the second gate dielectric 234. In other words, a combined gate dielectric 225 covering the top surface 222t_1x or 222t_1y of the first fin 212_1 has a first thickness $t_1$ and a second gate dielectric 234 covering the top surface 222t_2 and sidewalls 222s_2 of the second fin 212_2 has a second thickness $t_2$ less than the first thickness $t_1$. In some embodiments, a ratio of the first thickness $t_1$ to the second thickness $t_2$ is from 1.05 to 2.

Figure 10A:
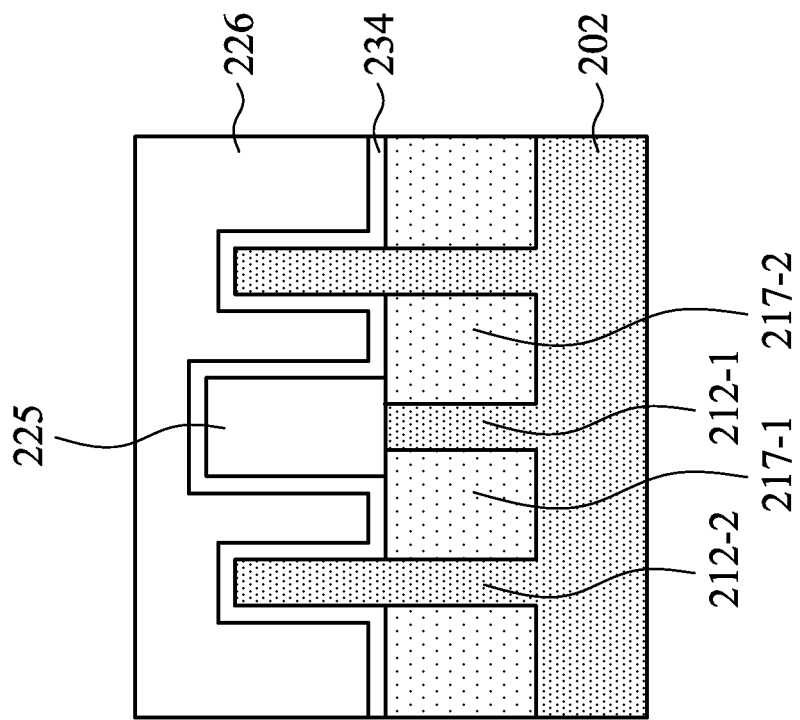
Figure 10B:
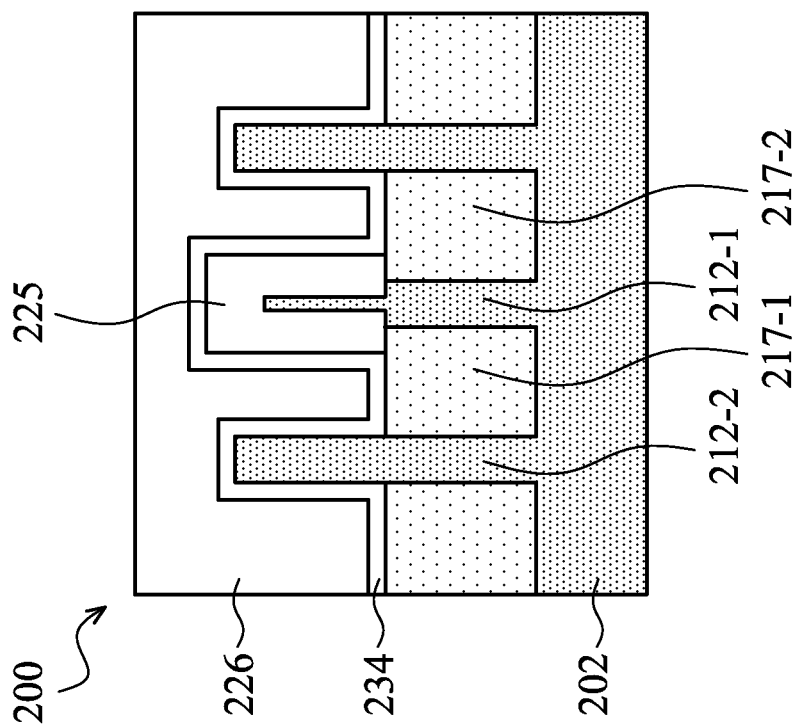

Referring to FIGS. 10A and 10B, after the second gate dielectric 234 formation process, a conductive gate strip 226 is then formed traversing over both the first gate dielectric 224a or 224b and second gate dielectric 234. In some embodiments, the conductive gate strip 226 covers more than one semiconductor fin 212_1, 212_2, so that the resulting FinFET 200 comprises more than one fin. In some embodiments, the conductive gate strip 226 comprises a single layer or multilayer structure. In some embodiments, the conductive gate strip 226 comprises poly-silicon. Further, the conductive gate strip 226 may be doped poly-silicon with the uniform or non-uniform doping. Alternatively, the conductive gate strip 226 comprises an N-work function metal, wherein the transistor is an n-type FinFET, wherein the N-work-function metal comprises a metal selected from a group of Ti, Ag, Al, TiAl, TiAlN, TaC, TaCN, TaSiN, Mn, and Zr. Alternatively, the conductive gate strip 226 comprises a P-work function metal, wherein the transistor is a p-type FinFET, wherein the P-work-function metal comprises a metal selected from a group of TiN, WN, TaN, and Ru. In some embodiments, the conductive gate strip 226 comprises a thickness in the range of about 30 nm to about 60 nm. The conductive gate strip 226 may be formed using a suitable process such as ALD, CVD, PVD, plating, or combinations thereof.

In some embodiments, a Fin field effect transistor (FinFET) 200 comprises a substrate 202 comprising a top surface 202s; a first fin 212_1 and a second fin 212_2 extending above the substrate top surface 202s, wherein each of the fins 212_1, 212_2 has a top surface and sidewalls; an insulation layer 217 between the first fine 212_1 and second fin 212_2 extending part way up the fins 212_1, 212_2 from the substrate top surface 202s; a combined gate dielectric 224 covering the top surface 222t_1x and sidewalls 222s_1x of the first fin 212_1 having a first thickness $t_1$ and a second gate dielectric 234 covering the top surface 222t_2 and sidewalls 222s_2 of the second fin 212_2 having a second thickness $t_2$ less than the first thickness $t_1$; and a conductive gate strip 226 traversing over both the first gate dielectric 224a or 224b and second gate dielectric 234. Accordingly, Applicant's method of fabricating a FinFET 200 may fabricate a FinFET operated while turning on the selected fin (the second fin) with thinner gate dielectric and not turning on the un-selected fin (the first fin) with thicker gate dielectric, thereby increasing a flexible circuit design.

It is understood that the FinFET 200 may undergo further CMOS processes to form various features such as source/drain, contacts/vias, interconnect metal layers, dielectric layers, passivation layers and other features known in the art.

One aspect of this description relates to a method of fabricating a Fin field effect transistor (FinFET). The method includes providing a substrate having a first fin and a second fin extending above a substrate top surface, wherein the first fin has a top surface and sidewalls and the second fin has a top surface and sidewalls. The method further includes forming an insulation layer between the first and second fins extending part way up the fins from the substrate top surface. The method further includes forming a photo-sensitive layer over the first and second fins. The method further includes patterning the photo-sensitive layer to expose the portion of the first fin above the insulation layer and cover the second fin. The method further includes forming a first gate dielectric having a first thickness covering the top surface and sidewalls of the first fin using a plasma doping process. The method further includes removing the photo-sensitive layer. The method further includes forming a second gate dielectric covering the top surface and sidewalls of the second fin having a second thickness less than the first thickness. The method further includes forming a conductive gate strip traversing over both the first gate dielectric and the second gate dielectric.

Another aspect of this description relates to a method of manufacturing a Fin field effect transistor (FinFET). The method includes recessing a substrate to form a first fin and a second fin extending above a recessed surface of the substrate, wherein the first fin has a top surface and sidewalls and the second fin has a top surface and sidewalls. The method further includes filling at least a portion of a space between the first fin and the second fin with an insulation layer. The method further includes forming a first gate dielectric covering the top surface and sidewalls of the first fin, wherein the first gate dielectric has a first thickness, and the first gate dielectric is in direct contact with the first fin. The method further includes forming a second gate dielectric covering the top surface and sidewalls of the second fin, wherein the second gate dielectric has a second thickness less than the first thickness, and the second gate dielectric is in direct contact with the second fin. The method further includes forming a conductive gate strip traversing over both the first gate dielectric and the second gate dielectric.

Still another aspect of this description relates to a method of manufacturing a Fin field effect transistor (FinFET). The method includes forming a first fin extending above a top surface of a substrate. The method further includes forming a second fin extending above the top surface of the substrate. The method further includes forming an insulation layer between the first fin and the second fin. The method further includes performing a plasma doping process on the first fin to form a first gate dielectric over a top surface of the first fin, wherein the plasma doping process consumes a portion of the first fin, and the first gate dielectric has a first thickness over the top surface of the first fin. The method further includes forming a second gate dielectric over the top surface and sidewalls of the second fin, wherein the second gate dielectric has a second thickness less than the first thickness. The method further includes forming a conductive gate strip traversing over both the first gate dielectric and the second gate dielectric.

While the invention has been described by way of example and in terms of embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a Fin field effect transistor (FinFET), the method comprising:
   providing a substrate having a first fin and a second fin extending above a substrate top surface and an insulation layer between the first and second fins extending part way up the first and second fins from the substrate top surface;
   forming a first gate dielectric having a first thickness using a plasma doping process directed to the first fin;
   forming a second gate dielectric on the second fin having a second thickness less than the first thickness; and
   forming a conductive gate strip traversing over both the first gate dielectric and the second gate dielectric.

2. The method of claim 1, wherein the plasma doping process consumes an upper portion of the first fin.

3. The method of claim 2, wherein a portion of the consumed upper portion of the first fin is coplanar with a top surface of the insulation layer interposing the first and second fins.

4. The method of claim 1, further comprising:
   forming the first fin and the second fin such that the first fin and the second fin have same dimensions.

5. The method of claim 1, further comprising:
   performing an anneal process on the substrate after forming the first gate dielectric and prior to forming the second gate dielectric.

6. The method of claim 1, further comprising:
   masking the second fin during the plasma doping process.

7. The method of claim 1, wherein the providing the substrate having the first fin and the second fin includes providing the first fin having a first width; and wherein the forming the first gate dielectric consumes the first fin to provide the first fin having a second width less than the first width.

8. The method of claim 1, wherein the forming the second gate dielectric includes depositing the second gate dielectric over the first gate dielectric.

9. The method of claim 1, wherein the providing the substrate having the first fin and the second fin includes providing the first and second fins having a first height extending above the insulation layer, and wherein the plasma doping process consumes the first fin to provide the first fin having a second height less than the first height.

10. A method of fabricating a semiconductor device, the method comprising:
    providing a substrate having a first fin and a second fin and an insulating region extending part way up the first and second fins;
    performing a plasma doping process on the first fin, wherein the plasma doping process consumes an upper portion of the first fin forming a dielectric region, wherein the upper portion of the first fin is disposed above a top surface of the insulating region;
    forming a gate dielectric on the second fin; and
    forming a conductive gate strip traversing over both the dielectric region and the gate dielectric on the second fin.

11. The method of claim 10, wherein the plasma doping process forms a dielectric region extending from a first lateral sidewall to an opposing second lateral sidewall of the first fin.

12. The method of claim 10, further comprising: defining the upper portion of the first fin extending from a region of the first fin coplanar with the insulating region to a top surface of the first fin.

13. The method of claim 10, wherein the forming the gate dielectric includes forming the gate dielectric over the consumed upper portion of the first fin.

14. The method of claim 10, wherein the forming the gate dielectric on the second fin includes depositing the gate dielectric directly on a sidewall of the second fin.

15. The method of claim 14, wherein the gate dielectric includes an interfacial layer underlying a second dielectric layer.

16. The method of claim 15, wherein the forming the gate dielectric includes forming the interfacial layer directly on the sidewall of the second fin; and thereafter depositing the second dielectric layer of high-k material on the interfacial layer.

17. A method of fabricating a Fin field effect transistor (FinFET), the method comprising:
    providing a substrate having a first fin and a second fin and an insulating region extending part way up the first and second fins;
    performing a plasma doping process on the first fin, wherein the plasma doping process consumes an upper portion of the first fin forming a dielectric region, wherein the upper portion of the first fin is disposed above a top surface of the insulating region; and
    masking the second fin during the performing the plasma doping process.

18. The method of claim 17, further comprising:
    forming a dielectric layer over the second fin after the performing the plasma doping process.

19. The method of claim 17, further comprising:
    forming a conductive gate strip traversing over both the dielectric region and the second fin.

20. The method of claim 17, wherein the plasma doping process implants oxygen to form the dielectric layer.

* * * * *